(12) United States Patent
Simon et al.

(10) Patent No.: US 6,661,269 B2
(45) Date of Patent: Dec. 9, 2003

(54) SELECTIVELY COMBINING SIGNALS TO PRODUCE DESIRED OUTPUT SIGNAL

(75) Inventors: Thomas D. Simon, Marlborough, MA (US); Rajeevan Amirtharajah, Providence, RI (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 09/792,497

(22) Filed: Feb. 23, 2001

(65) Prior Publication Data

US 2002/0118055 A1 Aug. 29, 2002

(51) Int. Cl.[7] .............................................. H03K 3/017
(52) U.S. Cl. ........................ 327/172; 327/176; 327/298
(58) Field of Search ................................. 327/172, 173, 327/174, 175, 176, 227, 291, 298; 326/104

(56) References Cited

U.S. PATENT DOCUMENTS

| 4,757,214 A | * | 7/1988 | Kobayashi ................. 327/172 |
| 4,797,585 A | * | 1/1989 | Segawa et al. ............. 327/172 |
| 5,003,194 A | * | 3/1991 | Engelhard ................... 327/176 |
| 5,138,188 A | * | 8/1992 | Bazes ......................... 327/172 |
| 5,396,110 A | * | 3/1995 | Houston ...................... 327/172 |
| 5,568,075 A | * | 10/1996 | Curran et al. ................ 327/172 |
| 5,654,988 A | * | 8/1997 | Heyward et al. ............ 375/355 |
| 5,812,000 A | * | 9/1998 | Kobayashi et al. .......... 327/172 |
| 5,815,041 A | * | 9/1998 | Lee et al. ........................ 331/8 |
| 5,828,249 A | * | 10/1998 | Sessions ...................... 327/115 |
| 5,892,380 A | * | 4/1999 | Quist ........................... 327/172 |
| 6,002,283 A | * | 12/1999 | Sywyk ......................... 327/173 |
| 6,025,745 A | * | 2/2000 | Lee et al. ..................... 327/277 |
| 6,111,447 A | * | 8/2000 | Ternullo, Jr. ................ 327/292 |
| 6,232,807 B1 | * | 5/2001 | Maruyama ................... 327/172 |
| 6,424,197 B1 | * | 7/2002 | Salcedo et al. .............. 327/276 |

\* cited by examiner

Primary Examiner—Timothy P. Callahan
Assistant Examiner—Hai L. Nguyen
(74) Attorney, Agent, or Firm—Blakely, Sokoloff, Taylor & Zafman LLP

(57) ABSTRACT

The present invention provides a mechanism for combining programming signals to provide an output signal, the properties of which depend only on selected properties of the programming signals. An embodiment of the invention includes first and second edge-to-pulse converters. The first edge-to-pulse converter generates an intermediate signal having a width determined by received initiation and termination signals. The second edge-to-pulse converter generates an output signal, responsive to the intermediate signal and the termination signal. The output signal has a width determined by a first edge of the initiation signal and a first edge of the termination signal.

2 Claims, 9 Drawing Sheets

SELECTIVELY COMBINING SIGNALS TO PRODUCE DESIRED OUTPUT SIGNAL

BACKGROUND OF THE INVENTION

1. Technical Field

The present invention relates to mechanisms for processing digital data, and in particular to mechanisms for combining signals to provide consistent output behavior.

2. Background Art

Digital systems often include circuitry that combines two or more signals to generate a new signal. For example, some communication systems encode data using pulse width modulation (PWM) to represent one or more bits of data in the width of an electronic pulse. One way to produce such a pulse is to generate a first signal that initiates the pulse and, at a delay determined by the states of one or more bits, to generate a second signal that terminates the pulse. The initiating and terminating signals ("programming signals") may be signal transitions such as the leading or trailing edges of pulses.

Because data is encoded in the pulse width, the initiating and terminating signals should generate data pulses with reproducible widths. Ideally, the width of the output pulse depends on only selected properties of the programming signals, and is substantially independent of other properties of the programming signals. For example, where the selected properties are the leading edges of the programming signals, the resulting pulse should be substantially independent of the width of either programming signal. Known circuits for combining signals to generate a new signal do not guarantee this independence.

FIG. 1 is a schematic diagram of an edge-to-pulse converter or generator 100. A pre-charge transistor 110 is connected in series with transistors 120 and 130, which perform an AND function for initiating and terminating signals. For the disclosed circuit, START is an initiating signal that is asserted when it is in a high voltage state, and _STOP is a terminating signal that is asserted when it is in a low voltage state. Pre-charge transistor 110 initializes node N to a high voltage state when _STOP is low (asserted). An inverter 140 converts the high voltage at node N to a low voltage state at output 142. When _STOP goes high, i.e. when the terminating signal is not asserted, N remains in the high voltage state as long as START is not asserted, and output 142 remains in the low voltage state. Converter 100 may be initialized by this sequence of signals.

With _STOP deasserted, an output pulse (O_PULSE) is initiated by asserting START. Node N discharges through transistors 120 and 130, driving output 142 to a high voltage state. In this state, node N is exposed to a parasitic capacitance at intermediate node M, between transistors 120 and 130. The parasitic capacitance is indicated by capacitor 150. When _STOP is asserted, i.e. driven low, the path to ground through transistor 130 is cut off. Node N is recharged to a high voltage state through transistor 110 and output 142 goes low, terminating O_PULSE.

Depending on its width, START may or may not still be asserted when _STOP is asserted. As a result, transistor 120 may be open or closed, and node N may or may not be exposed to parasitic capacitance 150 when O_PULSE is terminated. The difference in the capacitance seen by transistor 110 can alter the width of O_PULSE generated at output 142. For example, it may cause variations in the trailing edge of O_PULSE, providing, in effect, unintended modulation of its pulse width. Unintended width modulations can have significant consequences for data integrity, particularly at higher frequencies. For example, if these variations are significant compared to the differences between pulse widths representing different bit states, data can be corrupted.

The edge-to-pulse converter discussed above demonstrates a particular example of a more common problem that arises whenever signals are combined to generate an output. That is, the output may depend on properties of the signals to be combined in ways that are not desired.

The present invention addresses these and other problems associated with combining signals to generate an output.

BRIEF DESCRIPTION OF THE DRAWINGS

The present invention may be understood with reference to the following drawings, in which like elements are indicated by like numbers. These drawings are provided to illustrate selected embodiments of the present invention and are not intended to limit the scope of the invention.

DETAILED DESCRIPTION OF THE INVENTION

The following discussion sets forth numerous specific details to provide a thorough understanding of the invention. However, those of ordinary skill in the art, having the benefit of this disclosure, will appreciate that the invention may be practiced without these specific details. In addition, various well-known methods, procedures, components, and circuits have not been described in detail in order to focus attention on the features of the present invention.

Figure 1:
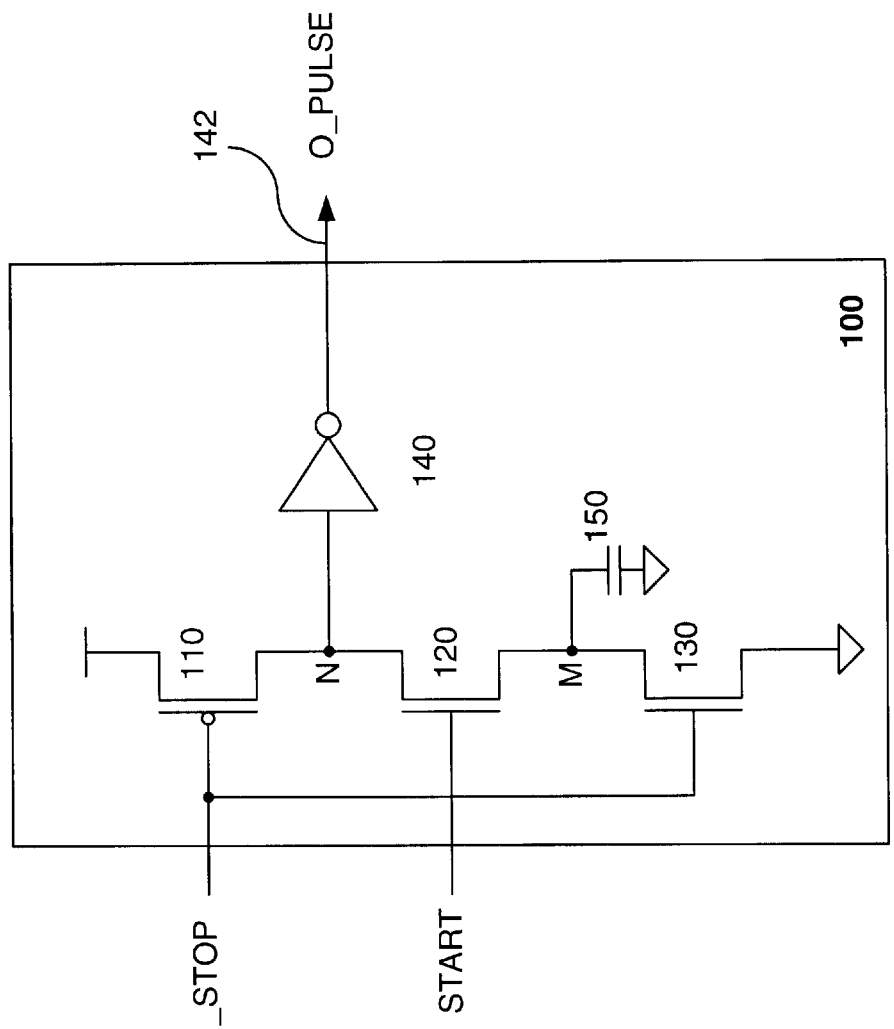
FIG. 1 is a circuit diagram of a conventional edge-to-pulse converter for generating an output signal from a pair of programming signals.
Figure 2:
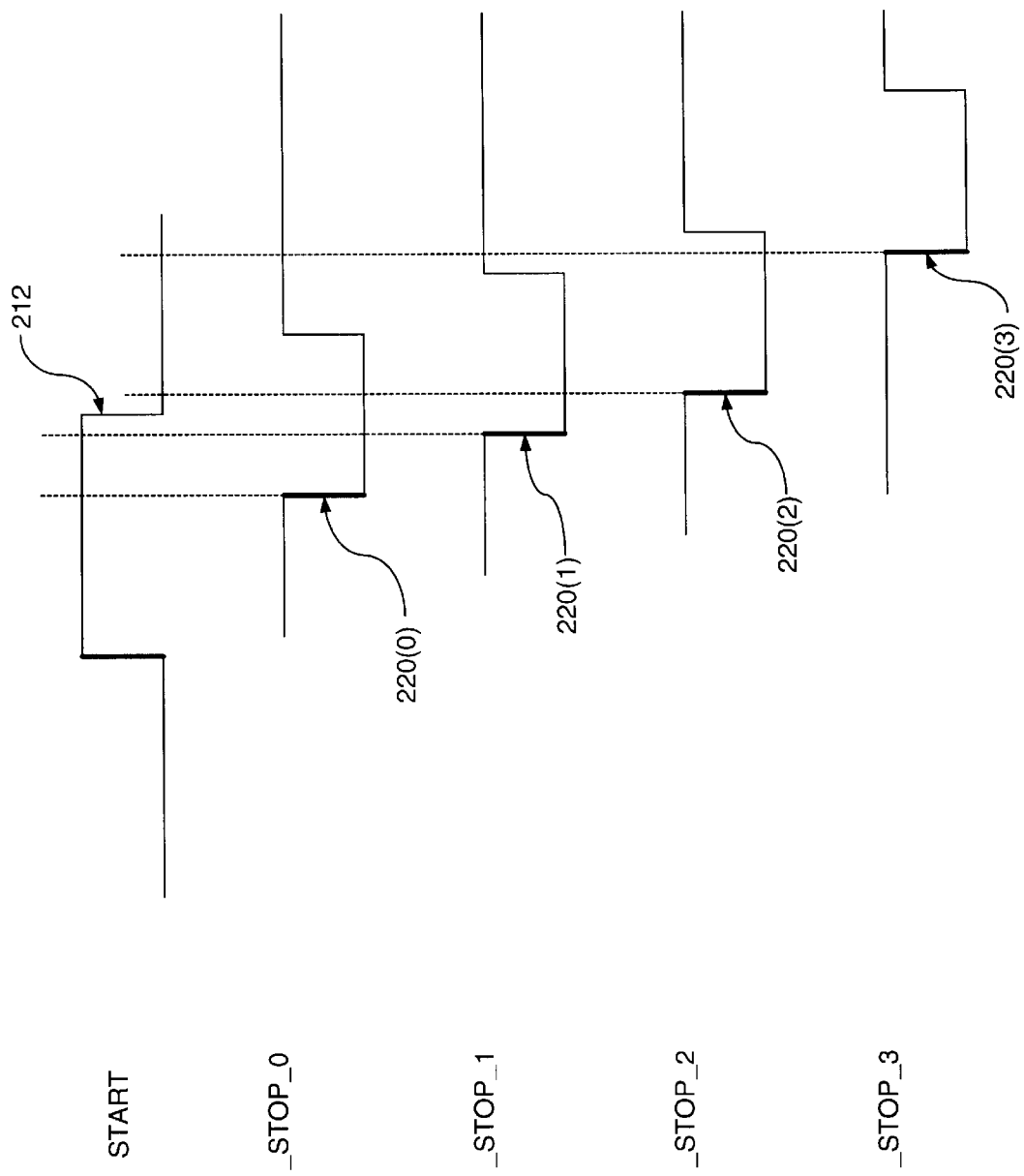
FIG. 2 is a timing diagram representing the voltage state relationships between an initiating signal and different terminating signals applied to the converter of FIG. 1.

FIG. 2 illustrates different combinations of programming signals (START and _STOP) that may be combined to provide a data pulse at output 142 of edge-to-pulse converter 100. As described above, START initiates generation of an output pulse (O_PULSE) when it is applied to the gate of transistor 120 (FIG. 1). _STOP_0 through _STOP_3 (generically, "_STOP") represent programming signals that terminate O_PULSE with one of four different pulse widths. For example, _STOP__STOP_3 may represent the four possible states of a pair of bits to be encoded. The selected _STOP terminates O_PULSE when its leading edge 220 is applied to the gates of transistors 110 and 130.

The resulting width of O_PULSE represents the state of the bit pair associated with the particular _STOP.

For _STOP_0, START is in a high voltage state when leading edge 220(0) is applied to transistor 130. Consequently, node N is exposed to parasitic capacitance 150 when output 142 transitions from high to low. For _STOP_3, START is in a low voltage state when leading edge 220(3) is applied to transistor 130. In this case, transistor 120 is already off, due to the low state of START, and node N is isolated from parasitic capacitance 150 when output 142 transitions from high to low. As a result, the trailing edge of O_PULSE generated by edge-to-pulse converter 100 may undergo additional, unintended modulation. The leading edges of _STOP_1 and _STOP_2 may occur relatively close to trailing edge 212 of START. This proximity may introduce additional variations in O_PULSE generated by edge-to-pulse converter 100.

The variations in width of O_PULSE described above are attributable to an unintended dependence on the width of START. That is, instead of providing consistent transitions responsive to the leading edges of START and _STOP, converter 100 may provide inconsistent results depending on where the trailing edge of START occurs relative to the leading edge of _STOP. This variability poses problems, particularly for high speed communications systems, where differences between widths of data pulses representing different bit states may be small. Small margins may be washed out by such variability.

Figure 3A:
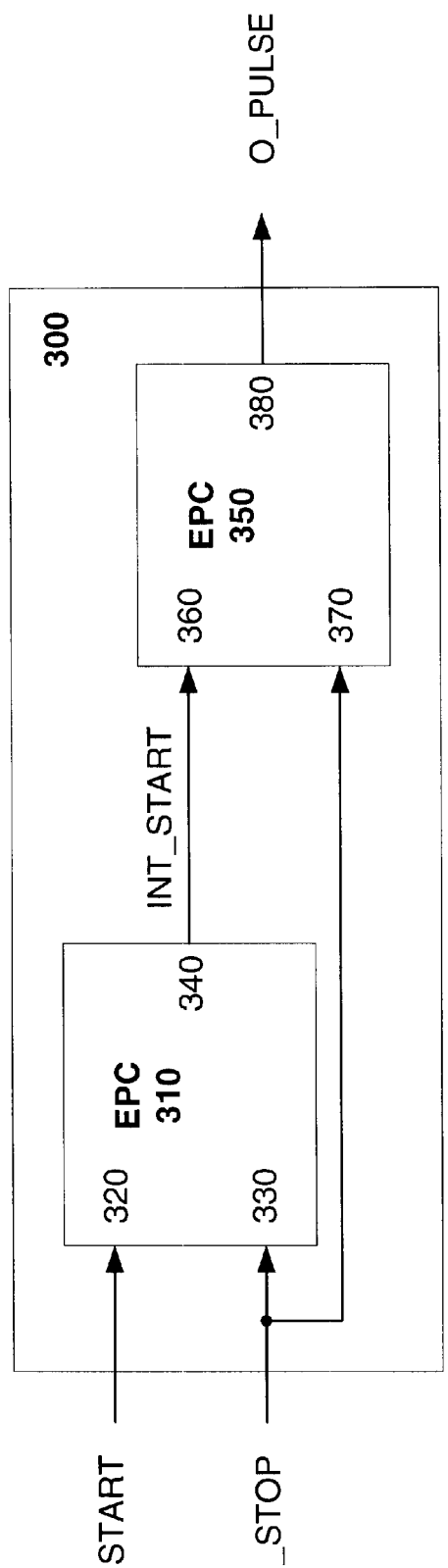
FIGS. 3A and 3B are block diagrams of two embodiments of edge-to-pulse converters in accordance with the present invention.

FIG. 3A is a block diagram of one embodiment of an edge-to-pulse converter 300 in accordance with the present invention. Converter 300 includes a first converter 310 having an initiate input 320, a terminate input 330, and an output 340, and a second converter 350 having an initiate input 360, a terminate input 370 and an output 380. An initiate signal (START) and a terminate signal (_STOP) are applied to initiate and terminate inputs 320 and 330, respectively, to generate an intermediate start signal (INT_START). As discussed in greater detail below, the width of INT_START is determined by START and _STOP. In particular, the trailing edge of INT_START is determined by _STOP and is subject to the unintended modulation described above. However, the trailing edge of INT_START, by design, does not affect the final signal.

INT_START and _STOP are applied to initiate input 360 and terminate input 370, respectively, of converter 350. Adjusting the trailing edge of INT_START responsive to _STOP allows converter 300 to impose a fixed relationship between INT_START and _STOP. That is, INT_START is driven to a consistent voltage state when _STOP is asserted, regardless of the difference between the leading edges of START and _STOP or the width of START.

Figure 4:
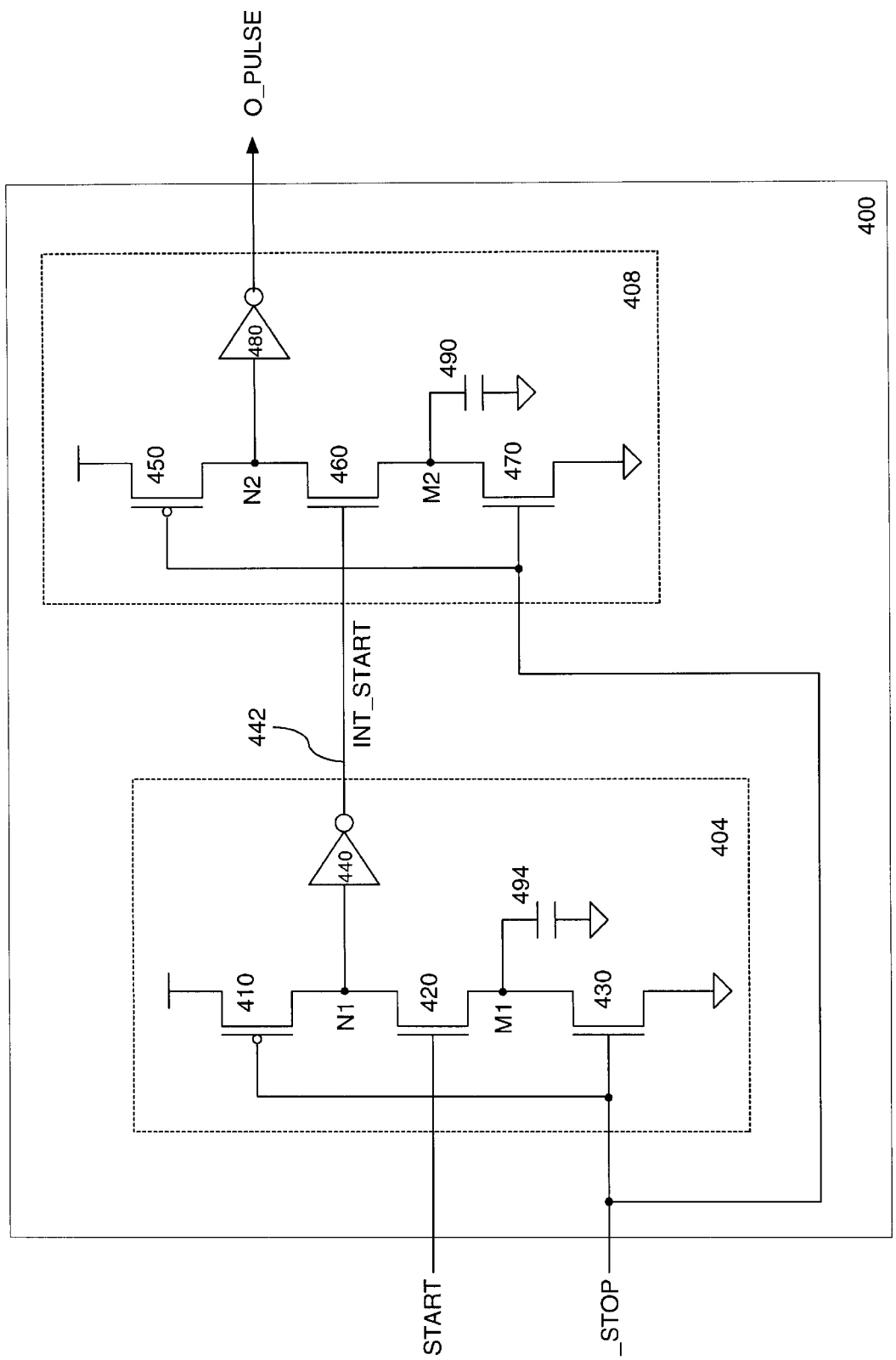
FIG. 4 is a circuit diagram of one embodiment of the edge-to-pulse converter of FIG. 3A.

FIG. 4 is a circuit diagram of one embodiment 400 of converter 300 in accordance with the present invention. Converter 400 includes first and second converters 404 and 408. Converter 404 includes a pre-charge transistor 410, coupled at a node N1 to transistors 420, 430, which perform an AND operation on START and _STOP. A parasitic capacitance at a node M1, between transistors 420 and 430, is indicated by a capacitor 494. The gate of transistor 420 is driven by START and the gates of transistors 410 and 430 are driven by _STOP. An inverter 440 couples node N1 to output 442, at which an intermediate initiation signal, INT_START, is provided. Converter 408 includes transistors 450, 460, 470 and inverter 480 in a configuration similar to that of transistors 410, 420, 430 and inverter 440, respectively, of converter 404. Nodes N2 and M2 of converter 408 correspond to nodes N1 and M1, respectively, of converter 404.

For the disclosed embodiment of converter 400, transistors 420 and 430 are turned on, shorting node N1 to ground if START is asserted (transitions to a high voltage state) while _STOP is deasserted (in a high voltage state). In this case, output 442 goes high to generate a leading edge for INT_START. When _STOP is asserted, transistor 430 turns off and pre-charge transistor 410 turns on, independent of whether START is still asserted, i.e. independent of the width of START. This drives node N1 high and output 442 low, terminating INT_START. Consequently, the width of INT_START is determined approximately by the difference between the leading edges of START and _STOP. The trailing edge of INT_START is subject to the same variation described above for the O_PULSE generated by converter 100, but the finite response time of converter 404 guarantees that INT_START remains high until after _STOP is asserted. As a result, this variation in the trailing edge of INT_START does not alter O_PULSE.

INT_START and _STOP are applied to converter 408 to generate O_PULSE. Because converter 404 guarantees that the trailing edge of INT_START follows the leading edge of _STOP for the disclosed embodiment of converter 400, transistor 460 is always turned on when node N2 transitions from low to high in response to assertion of _STOP. Consequently, node N2 sees parasitic capacitance 490, no matter what the relative states of START and _STOP at the initiating and terminating inputs of converter 400.

Figure 5:
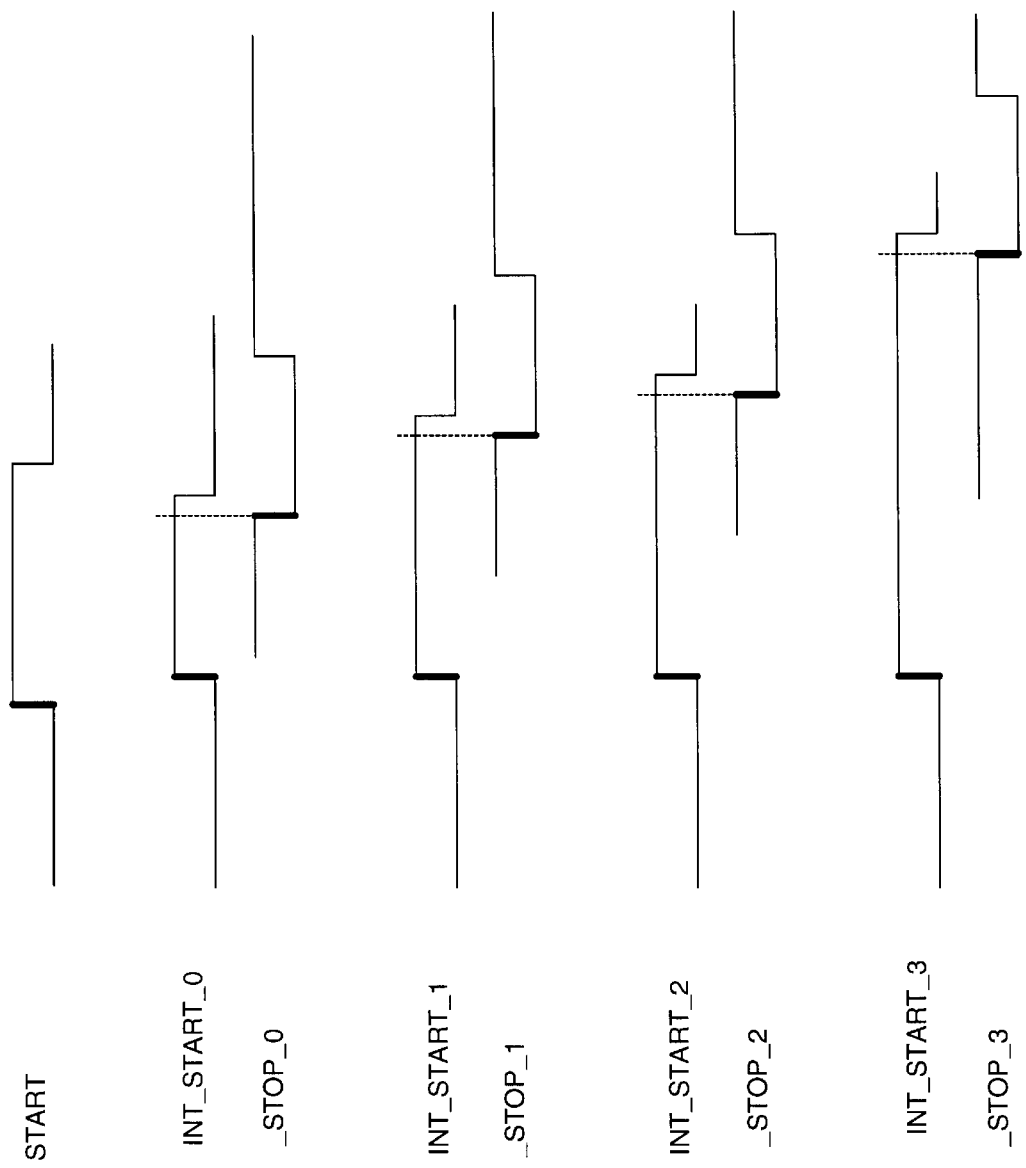
FIG. 5 is a timing diagram representing the programming signals generated by the edge-to-pulse converter of FIG. 3A.

FIG. 5 represents the relative timing of START and INT_START generated by the disclosed embodiment of converter 400 for different _STOP signals, e.g. for different pulse widths. The edges of the initiation and termination signals to which converter 400 responds are indicated by heavy lines. In each instance, the leading edge of _STOP occurs while INT_START is in the same state, even though START is in different voltage states for the different _STOP signals. For the disclosed embodiment of converter 300, the different instances of _STOP terminate O_PULSE while INT_START is high. For the circuit of FIG. 4, this means that pre-charge transistor 450 sees the parasitic capacitance at node M2 as the trailing edge of O_PULSE is generated, regardless of the relative state of START when the leading edge of _STOP occurs. The particular logic states of the programming signals (START, _STOP) are used for illustration only. The present invention does not depend on the particular logic state to which the initiating signal is driven or the particular combination of logic states that initiate and terminate the data pulse.

Referring again to FIG. 3A, converter 310 introduces a delay in INT_START relative to START. In effect, converter 310 feeds forward information about _STOP to converter 350. One result of this feed-forward loop is that the difference between the leading edges of INT_START and _STOP, i.e. the width of O_PULSE, will be reduced relative to the difference between the leading edges of START and _STOP. As long as this reduction is consistent for all _STOP pulses, it can be accounted for readily. For other embodiments of the invention, different modifications of START may be employed to ensure a consistent operation of converter 350. For example, feedback from O_PULSE may be used to modify START. Generating INT_START with feedback from O_PULSE may introduce a greater delay to the trailing edge of INT_START, because of the delay through generator 350 to O_PULSE. The greater width of the resulting INT_START pulse may approach limits imposed by the cycle time of CLK_PULSE.

Figure 3B:
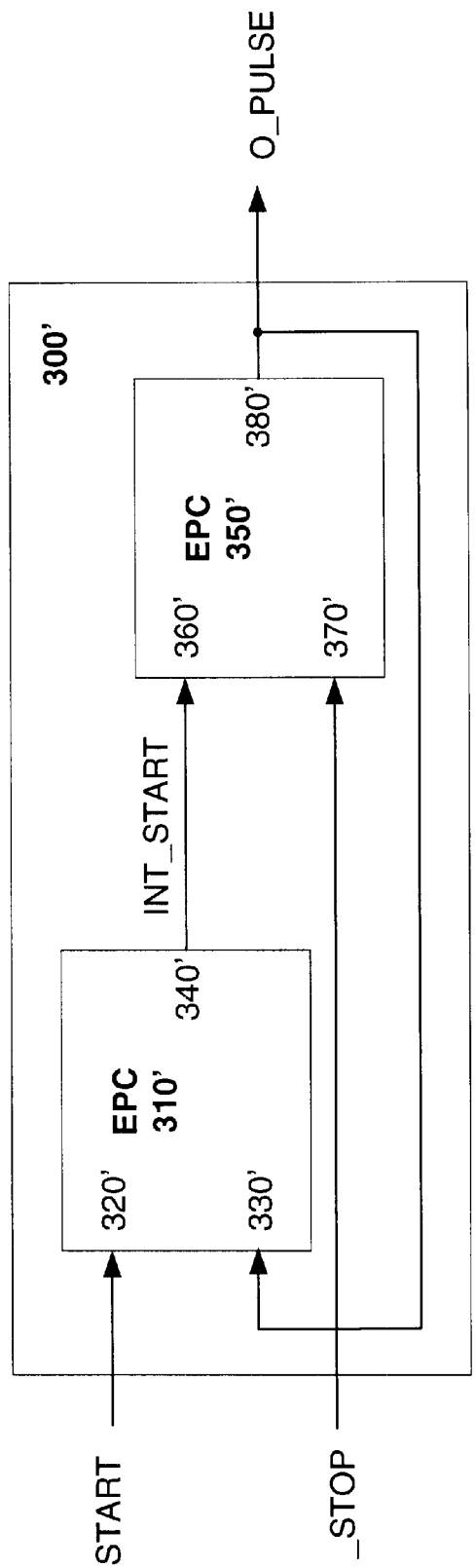

FIG. 3B is a block diagram of one embodiment 300' of a converter that modifies START using feedback from O_PULSE. For this embodiment, INT_START is terminated responsive to the trailing edge of O_PULSE, which ensures that INT_START remains asserted at least until _STOP is asserted.

Figure 6B:
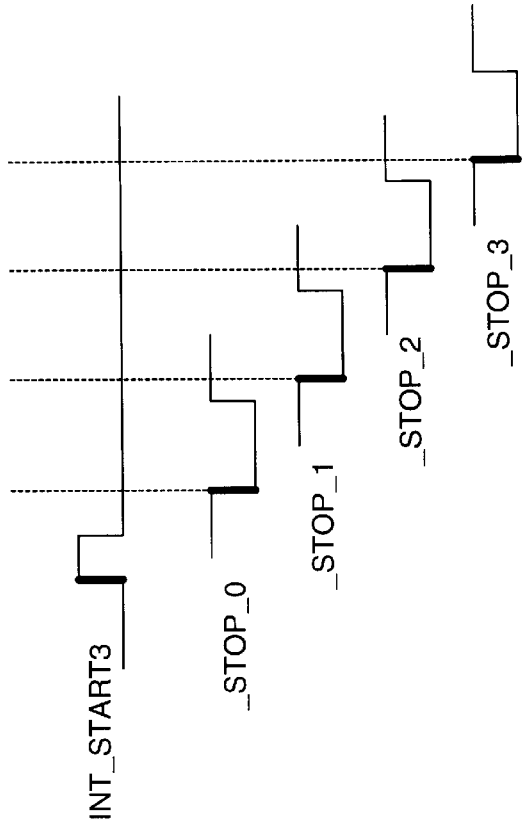
FIGS. 6A and 6B are timing diagrams of alternative programming signals that may be used to provide consistent data pulse widths for given programming signals.
Figure 6A:
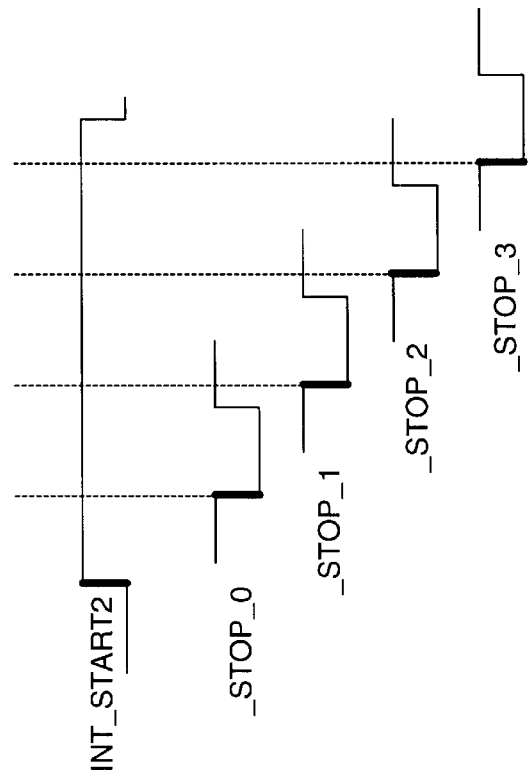

In addition, FIGS. 6A and 6B illustrate alternative schemes for ensuring a consistent electrical environment for combining signals. For example, FIG. 6A represents an intermediate signal (INT_START2), the width of which is greater than the delay between the leading edge of INT_START2 and the leading edge of the terminating signal that represents the largest pulse width for O_PULSE (_STOP_3). The intermediate signal, INT_START2, may be generated by circuitry that duplicates the delay between START and _STOP_3 and terminates INT_START2 following this delay. However, this approach employs more complex circuitry than that disclosed for, e.g., converter 400. Further, if INT_START2 is too wide, it may limit the cycle time of programming signals applied to converter 300.

FIG. 6B represents an intermediate signal, INT_START3), the width of which is less than the delay between the leading edge of INT_START3 and the leading edge of the terminating signal that represents the narrowest pulse width for O_PULSE (_STOP_0). The pulse width for INT_START3 may be provided, for example, by terminating the intermediate signal using a delayed version of START. For this embodiment, the width of INT_START3 is determined by the delay. This implementation has to account for low pass filtering, which could reduce the amplitude of a INT_START3 below a level of reliable detection, as it is transmitted through various circuit elements.

Figure 7A:
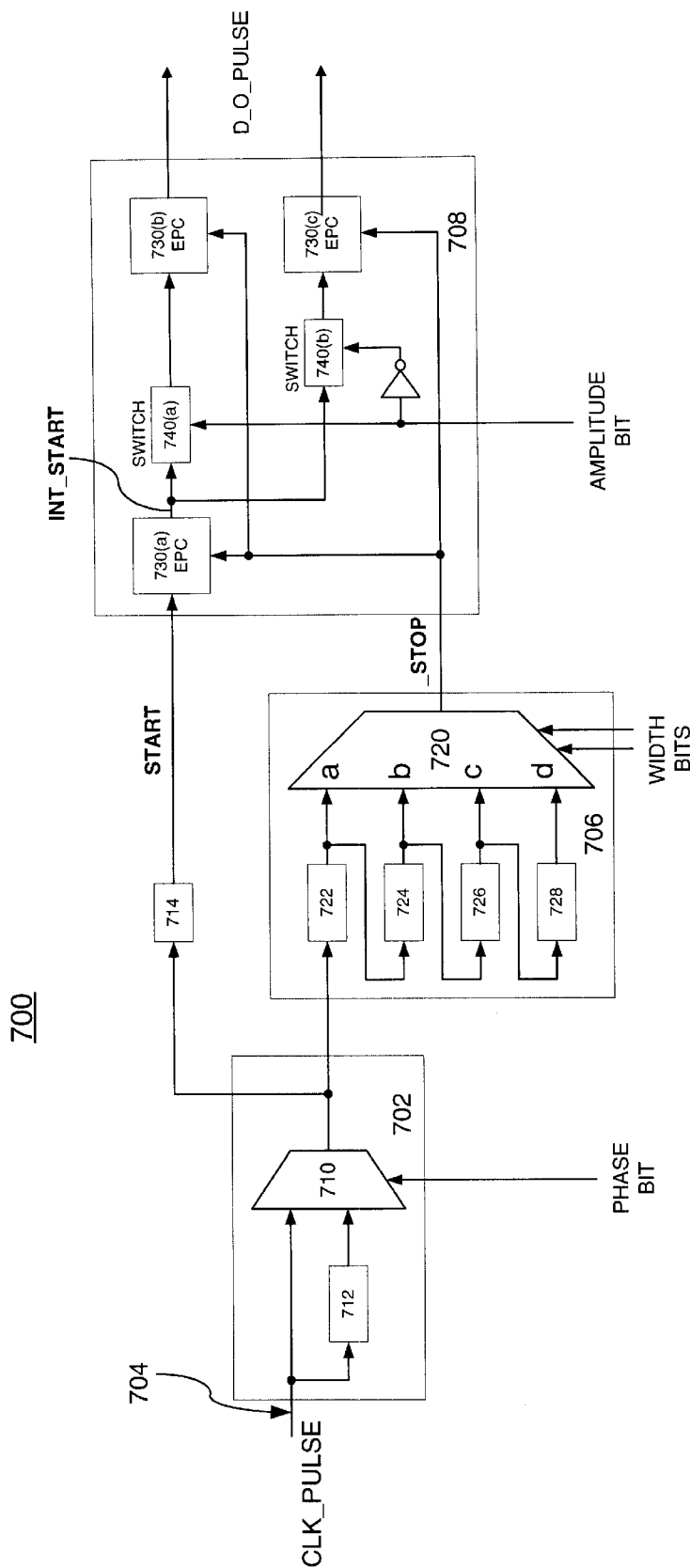
FIG. 7A is a circuit diagram of one embodiment of a transmitter that incorporates an edge-to-pulse converter in accordance with the present invention.

FIG. 7A is a circuit diagram of a transmitter 700 including an edge-to-pulse converter in accordance with the present invention. Transmitter 700 comprises a phase modulator 702, a pulse width modulator 706 and an amplitude modulator 708. The disclosed embodiment of transmitter 700 modulates a clock signal (CLK_PULSE) to encode four outbound bits per symbol period. One bit is encoded in the symbol's phase (phase bit), two bits are encoded in the symbol's width (width bits) and one bit is encoded in the symbol's amplitude (amplitude bit). Transmitter 700 may be used to generate a differential symbol pulse per symbol period.

Phase modulator 702 includes a MUX 710 and delay module (DM) 712. MUX 710 receives a delayed version of CLK_PULSE via DM 712 and an undelayed version of CLK_PULSE from input 704. The control input of MUX 710 transmits a delayed or undelayed CLK_PULSE responsive to the value of the phase bit. In general, a phase modulator 702 that encodes p phase bits may select one of $2^P$ versions of CLK_PULSE subject to different delays. For the disclosed embodiment, the output of phase modulator 702 indicates the leading edge of a symbol and serves as a timing reference for generation of the trailing edge by width modulator 706. A delay-matching block (DMB) 714 is provided to offset circuit delays in width modulator 706 (such as the delay of MUX 720) which might detrimentally impact the width of the symbol. The output of DMB 714 is an initiation signal (START), which is provided to an edge-to-pulse converter (730(a)) associated with amplitude modulator 708 for additional processing.

Width modulator 706 includes DMs 722, 724, 726, 728, and MUX 720 to generate a second edge that is delayed relative to the first edge by an amount indicated by the width bits. The delayed second edge forms a termination signal (_STOP) that is input to amplitude modulator 708. For the disclosed embodiment of transmitter 700, two bits applied to the control input of MUX 720 select one of four different delays for the second edge, which is provided at the output of MUX 720. Inputs a, b, c, and d of MUX 720 sample the input signal, i.e. the leading edge, following its passage through DMs 722, 724, 726, and 728, respectively. If the width bits indicate input c, for example, the second edge output by MUX 720 is delayed by DM 722+DM 724+DM 726 relative to the first edge.

Amplitude modulator 708 uses START and _STOP to generate a symbol pulse having a leading edge, a width, and a polarity indicated by the phase, width, and amplitude bits, respectively, provided to transmitter 700 for a given symbol period. Amplitude modulator 708 includes edge-to-pulse converters (EPC) 730(a), 730(b) and 730(c) and switches 740(a) and 740(b). EPC 730(a) operates with either EPC 730(b) or EPC 730(c), depending on the states of switches 740(a) and 740(b), to form a converter in accordance with the present invention. For example, START and _STOP are applied to EPC 730(a) to generate INT_START. INT_START and _STOP are routed to EPC 730(b) or 730(c), depending on the state of an amplitude bit, to generate a differential output signal, D_O_PULSE. For one embodiment of transmitter 700, switches 740 may be AND gates. On receipt of INT_START, EPC 730(b) or 730(c) initiates D_O_PULSE, which is terminated on receipt of _STOP. Depending on which pair of EPCs 730 is activated, a positive or a negative going pulse is provided to the output of transmitter 700.

The programmable delays used in the disclosed phase modulator 702 and width modulator 706 are used to provide the reliable, relative timings of START and _STOP required for high bandwidth communication, such as that provided by transmitter 700. Circuits other than the programmable delays, such as MUX 720, are not easily designed to provide consistent delay performance. For this reason, DMB 714 is used to offset unwanted delays. The present invention may be used to ensure that relative timings are due to the controlled delay elements, not to variable conditions such as those described above for the circuit of FIG. 1.

Figure 7B:
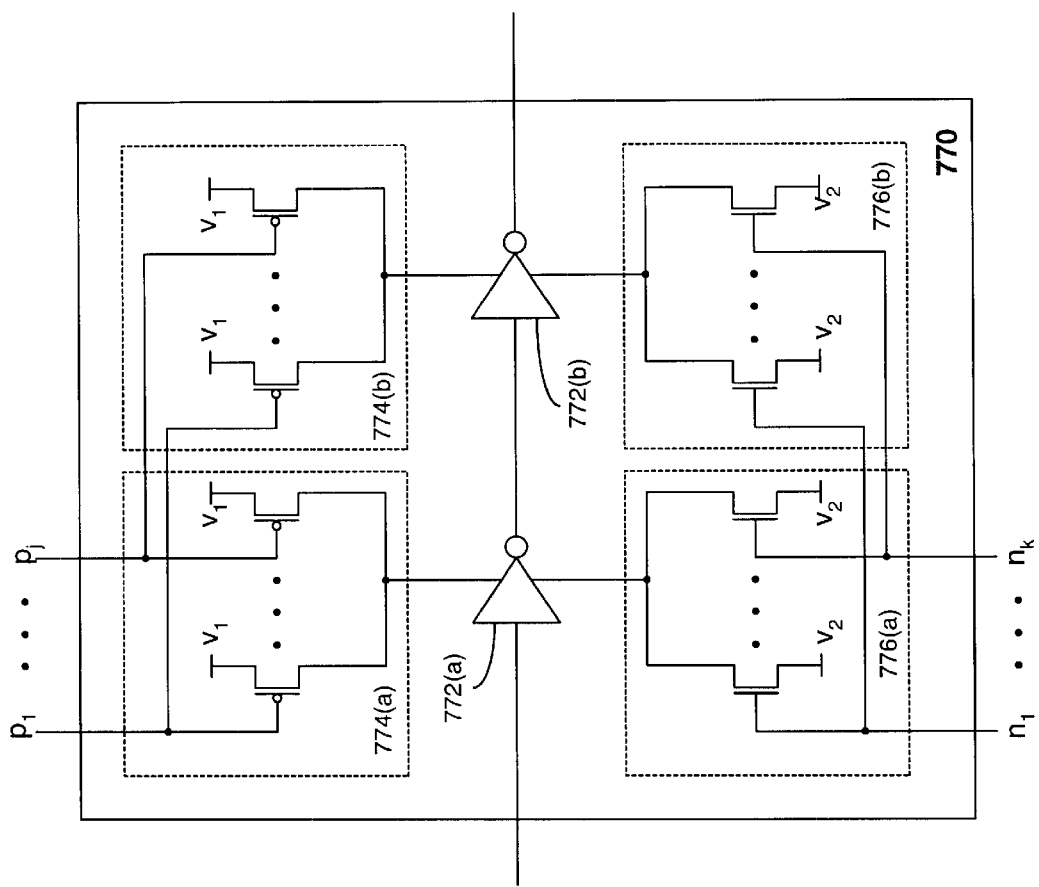
FIG. 7B is a circuit diagram of one embodiment of a delay module that may be used in the transmitter of FIG. 7A.

FIG. 7B is a schematic diagram of one embodiment of a programmable delay module (DM) 770 that is suitable for use with transmitter 700. For example, one or more DMs 770 may be used for any of DMs 712, 722, 724, 726 and 728 in the disclosed embodiment of transmitter 700 to introduce programmable delays in START and _STOP. DM 770 includes inverters 772(a) and 772(b) that are coupled to reference voltages $V_1$ and $V_2$ through first and second transistor sets 774(a), 774(b) and 776(a), 776(b), respectively. Reference voltages $V_2$ and $V_2$ may be the digital supply voltages in some embodiments. Programming signals, $p_1$–$p_j$ and $n_1$–$n_k$, applied to transistor sets 774(a), 774(b) and 776(a), 776(b), respectively, alter the conductances seen by inverters 772(a) and 722(b) and, consequently, their speeds. Programming signals, $p_1$–$p_j$ and $n_1$–$n_k$, for inverters 772(a) and 772(b) may be provided by a system, a user, or a calibration circuit.

There has thus been disclosed a mechanism for combining programming signals to provide an output signal, the behavior of which depends only on a selected property of the programming signals. An embodiment of the invention includes a circuit having a first stage and a second stage. The first stage receives an initiating signal and a terminating signal and generates an intermediate initiating signal that has a specified relationship with the terminating signal. For the disclosed embodiments, the intermediate signal is in a specified voltage state when a programming feature, e.g. a leading edge, of the terminating signal is received, regardless of the width of the initiating signal. The second stage of the circuit combines the intermediate initiating signal and the terminating signal to provide an output signal that is independent of the width of the initiating signal.

The disclosed embodiments have been provided to illustrate various features of the present invention. Persons skilled in the art of circuit design, having the benefit of this disclosure, will recognize variations and modifications of the disclosed embodiments, which none the less fall within the spirit and scope of the appended claims.

We claim:

1. A circuit comprising:

a start pulse source to generate a start pulse having a width;

a stop pulse source to generate a stop pulse having a delay relative to the start pulse, determined by a bit;

a first edge-to-pulse converter to generate an intermediate pulse having a width determined by the start pulse and a first edge of the stop pulse; and a second edge-to-pulse converter to generate a symbol having a width determined by a first edge of the intermediate pulse and the first edge of the stop pulse, wherein the second edge-to-pulse converter includes an AND gate that is driven by the intermediate and stop pulses.

2. The circuit of claim 1, wherein the stop pulse source includes a sequence of delay modules that may be sampled at selected locations of the sequence to provide the selected delay.

* * * * *